United States Patent
Hoyack et al.

(10) Patent No.: US 10,446,955 B2
(45) Date of Patent: Oct. 15, 2019

(54) SHIELDED CONNECTOR FOR INTERCONNECTING PRINTED CIRCUIT BOARDS

(71) Applicant: Amphenol Corporation, Wallingford, CT (US)

(72) Inventors: Michael A. Hoyack, Sandy Hook, CT (US); Joachim I. Grek, Katrineholm (SE); Owen R. Barthelmes, Putnam Valley, NY (US)

(73) Assignee: Amphenol Corporation, Wallingford, CT (US)

(*) Notice: Subject to any disclaimer, the term of this patent is extended or adjusted under 35 U.S.C. 154(b) by 0 days.

(21) Appl. No.: 15/951,670

(22) Filed: Apr. 12, 2018

(65) Prior Publication Data

US 2018/0301829 A1    Oct. 18, 2018

Related U.S. Application Data

(60) Provisional application No. 62/485,628, filed on Apr. 14, 2017.

(51) Int. Cl.
| | |
|---|---|
| H01R 12/00 | (2006.01) |
| H01R 13/658 | (2011.01) |
| H01R 12/52 | (2011.01) |
| H01R 13/629 | (2006.01) |
| H05K 1/14 | (2006.01) |
| H01R 12/70 | (2011.01) |
| H01R 12/73 | (2011.01) |
| H01R 12/91 | (2011.01) |
| H01R 13/6582 | (2011.01) |
| H01R 13/6594 | (2011.01) |

(52) U.S. Cl.
CPC ....... *H01R 12/523* (2013.01); *H01R 12/7011* (2013.01); *H01R 12/73* (2013.01); *H01R 12/91* (2013.01); *H01R 13/62983* (2013.01); *H01R 13/658* (2013.01); *H01R 13/6582* (2013.01); *H01R 13/6594* (2013.01); *H05K 1/14* (2013.01)

(58) Field of Classification Search
None
See application file for complete search history.

(56) References Cited

U.S. PATENT DOCUMENTS

| | | |
|---|---|---|
| 4,514,784 A | 4/1985 | Williams |
| 5,137,462 A | 8/1992 | Casey |
| | (Continued) | |

FOREIGN PATENT DOCUMENTS

| | | |
|---|---|---|
| EP | 2 445 060 A1 | 4/2012 |
| TW | M539713 U | 4/2017 |
| WO | WO 2017/019763 A1 | 2/2017 |

*Primary Examiner* — Xuong M Chung Trans
(74) *Attorney, Agent, or Firm* — Blank Rome LLP

(57) ABSTRACT

A shielded connector for interconnecting printed circuit boards that has a contact assembly that includes a plurality of contacts electrically connectable to the printed circuit boards, first and second guide members that separable from the contact assembly and associated with one of the printed circuit boards, and shielding that establishes electrical continuity through the connector. The contact assembly and the first and second guide members are configured to provide axial and radial float to compensate for axial and radial misalignment between the printed circuit boards.

21 Claims, 7 Drawing Sheets

(56) References Cited

U.S. PATENT DOCUMENTS

| | | | |
|---|---|---|---|
| 5,928,000 A * | 7/1999 | Rudisill | H01R 13/2407 |
| | | | 439/63 |
| 6,231,352 B1 * | 5/2001 | Gonzales | H01R 12/52 |
| | | | 439/66 |
| 6,497,579 B1 | 12/2002 | Garbini | |
| 6,695,622 B2 | 2/2004 | Korsunsky | |
| 6,749,441 B1 | 6/2004 | Ma | |
| 6,773,285 B2 | 8/2004 | Bernat | |
| 7,108,567 B1 | 9/2006 | Korsunsky et al. | |
| 7,503,773 B2 * | 3/2009 | Tokunaga | H01R 12/58 |
| | | | 439/74 |
| 7,544,104 B2 * | 6/2009 | Fan | H01R 12/52 |
| | | | 439/65 |
| 7,740,488 B2 | 6/2010 | Taylor | |
| 8,360,789 B2 * | 1/2013 | Yin | H01R 12/52 |
| | | | 439/66 |
| 8,485,831 B2 | 7/2013 | Cipolla | |
| 8,597,050 B2 | 12/2013 | Flaherty | |
| 8,721,350 B2 | 5/2014 | Liu | |
| 8,734,167 B2 | 5/2014 | Aimoto | |
| 8,979,562 B2 | 3/2015 | Crighton | |
| 9,039,433 B2 | 5/2015 | Barthelmes | |
| 9,484,688 B2 | 11/2016 | Hugel | |
| 9,502,836 B2 | 11/2016 | Hashiguchi | |
| 10,044,120 B2 | 8/2018 | Wang | |
| 2016/0064839 A1 | 3/2016 | Goodman | |
| 2018/0151967 A1 | 5/2018 | Chen et al. | |

\* cited by examiner

SHIELDED CONNECTOR FOR INTERCONNECTING PRINTED CIRCUIT BOARDS

RELATED APPLICATION

The present application claims priority to U.S. provisional application No. 62/485,628, filed Apr. 14, 2017, the entire disclosure of which is incorporated herein by reference.

FIELD OF THE INVENTION

The present invention relates to a connector for interconnecting two printed circuit boards that is shielded to provide grounding and reduce signal interference while also being and providing both axial and radial float between the printed circuit boards.

BACKGROUND OF THE INVENTION

Most board-to-board RF solutions feature a bullet with a signal contact surrounded by a full coaxial ground. This, however, is insufficient for providing the proper shielding and impedance to the interconnect system. A need exists for a board-to-board connector that has sufficient shielding to protect against signal interference and achieve the proper impedance for the interconnect.

SUMMARY OF THE INVENTION

The present invention may provide a shielded connector for interconnecting printed circuit boards that comprises a contact assembly that includes a plurality of contacts electrically connectable to the printed circuit boards, first and second guide members that are separable from the contact assembly and associated with the printed circuit boards, and first and second shields electrically connectable to the printed circuit boards. The first and second shields substantially surround at least a portion of the first and second guide members, respectively. Each of the first and second shields may have at least one portion configured to contact the other of the first and second shields, thereby creating electrical continuity therebetween.

In certain embodiments, the at least one portion of the first shield is an extension feature that contacts the second shield; the extension feature is at least one spring arm that contacts a frame of the second shield; the at least one portion of the second shield is an extension feature that contacts the first shield; each extension feature comprises at least one spring arm that extends from a frame of the first and second shields, respectively, and the at least one spring arm of the first shield contacts the frame of the second shield and the at least one spring arm of the second shield contacts the frame of the first shield; and/or each extension feature comprises a plurality of spring arms and one of the plurality of spring arms and shorter than the other of the plurality of spring arms.

In other embodiments, each of the first and second shields comprises a frame with opposite first and second sides and opposite first and second ends extending between the sides, the at least one portion of the first shield is an extension feature that extends from one or both of the sides of the frame of the first shield to contact the frame of the second shield; the extension feature extends from one or both of the ends of the frame of the first shield to contact the frame of the second shield; the at least one portion of the second shield is an extension feature that extends from one or both of the sides of the frame of the second shield to contact the frame of the first shield; the extension feature extending from one or both sides of the frame of the first shield contacts one or both of the ends of the frame of the second shield; each of the extension features comprises one or more spring arms, each spring arm of one of the first and second shields has a free end for contacting the frame of the other of the first and second shields; the first and second shields are substantially identical; and/or the contact assembly and the first and second guide members are configured to provide axial and radial float to compensate for axial and radial misalignment between the printed circuit boards.

The present invention may further provide a shielded connector for interconnecting printed circuit boards that comprises a contact assembly that includes a plurality of contacts electrically connectable to the printed circuit boards, first and second guide members that are separable from the contact assembly and associated with one of the printed circuit boards, and a shield electrically connectable to the printed circuit boards. The shield substantially surrounds at least a portion of the contact assembly. The shield may have portions at opposing ends thereof, respectively, configured to contact the printed circuit boards, thereby creating electrical continuity therebetween.

In some embodiments, the shield surrounds the contact assembly and each portion is an extension feature configured to electrically engage one of the printed circuit boards, the shield is disposed between the first and second guide members, each extension feature comprises at least one spring arm; each spring arm has folded shape; the at least one spring arm extending from one end of the shield has a different shape than the at least one spring arm extending from the other end of the shield; and/or each spring arm has a curved shape.

The present invention may yet further provide a shielded connector for interconnecting printed circuit boards that comprises a contact assembly that includes a plurality of contacts electrically connectable to the printed circuit boards, first and second guide members that separable from the contact assembly and associated with one of the printed circuit boards, and means for shielding that establishes electrical continuity through the connector. The contact assembly and the first and second guide members may be configured to provide axial and radial float to compensate for axial and radial misalignment between the printed circuit boards.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENT

Referring to the figures, the present invention relates to a shielded connector, such as an RF connector, for interconnecting two printed circuit boards 10 and 12. The shielding feature of the connector of the present invention is designed to improve impedance consistency and reduce signal interface, such as by preventing signal leakage (crosstalk) between closely placed signal lines in the connector. The shielded connector of the present invention does this while also having both high float capability and a low profile for interconnecting the two printed circuit boards 10 and 12.

Figure 1A:
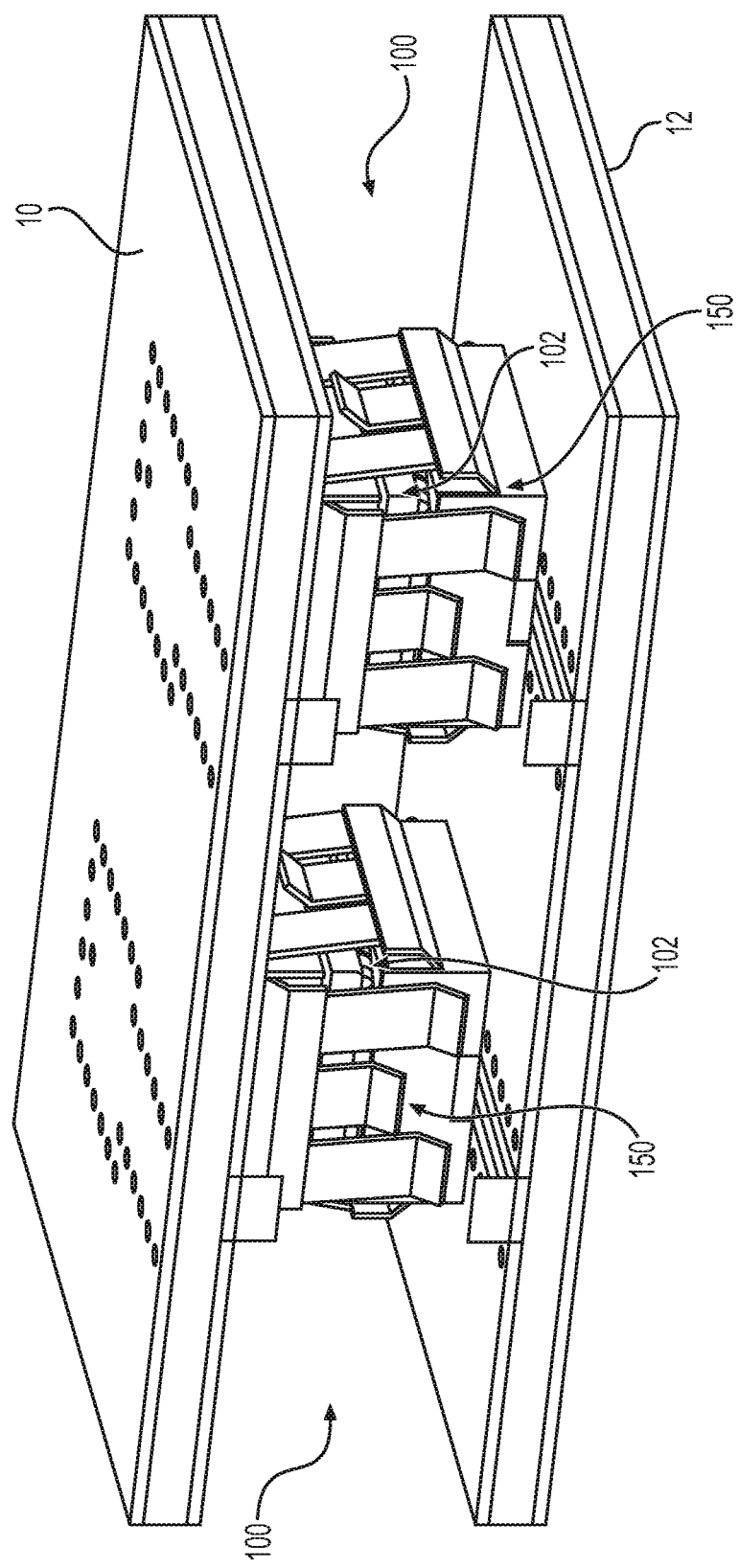
FIG. 1A is a perspective view of shielded connectors according to a first exemplary embodiment of the present invention, showing the connector interconnecting two printed circuit boards
Figure 1B:
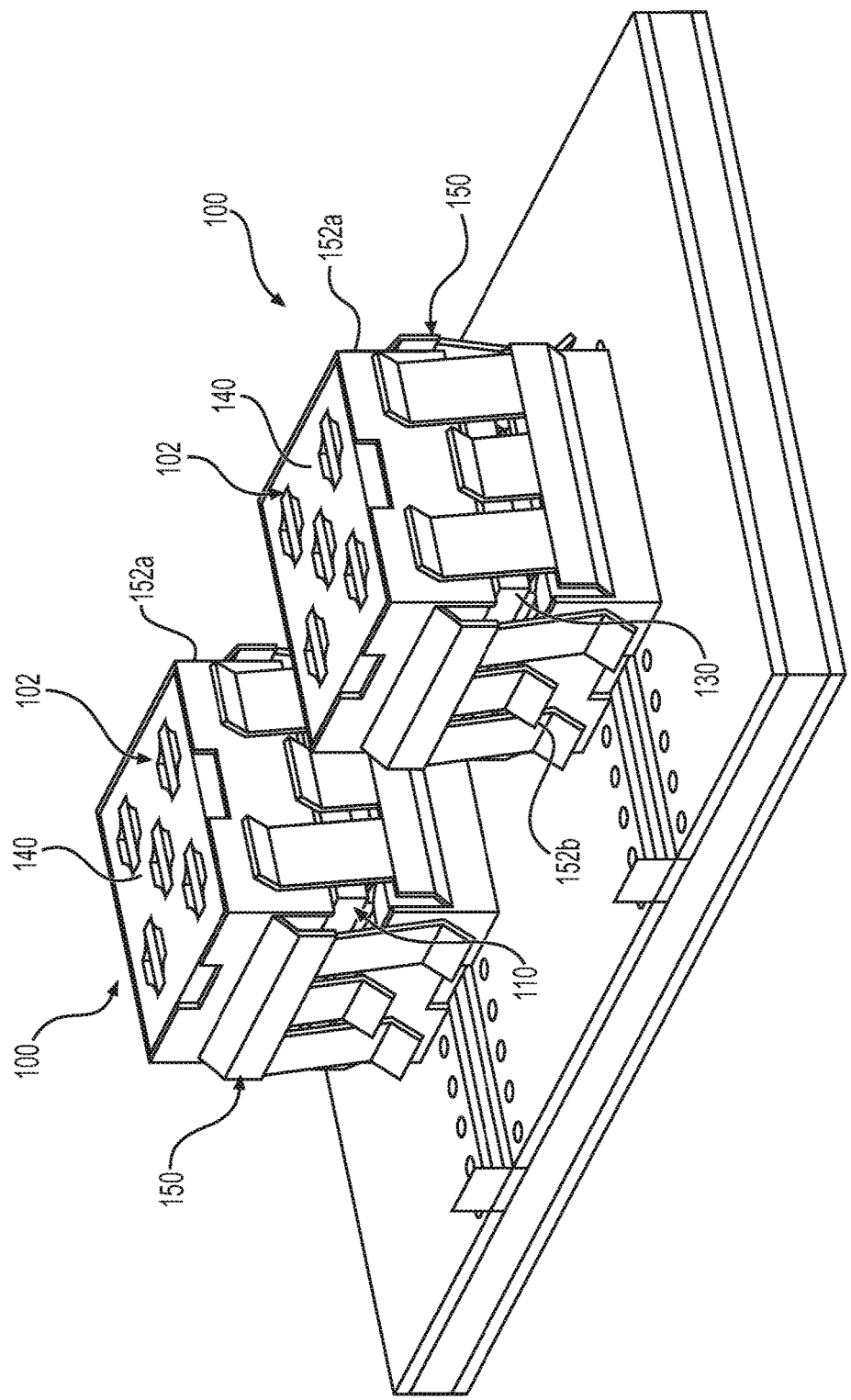
FIG. 1B is a perspective view similar to FIG. 1A with one printed circuit board removed for clarity.
Figure 2B:
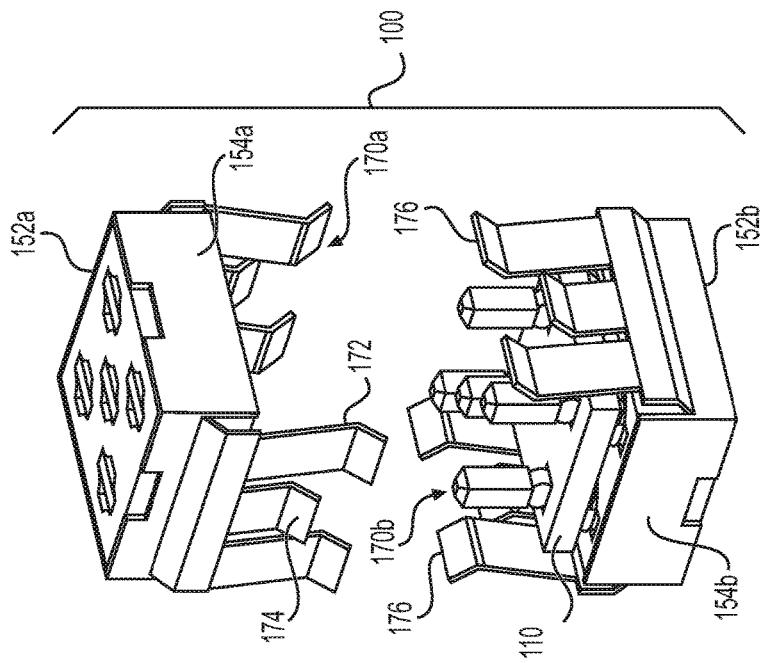
FIGS. 2A thru 2C are various exploded perspective views of the shielded connector illustrated in FIGS. 1A and 1B.
Figure 2A:
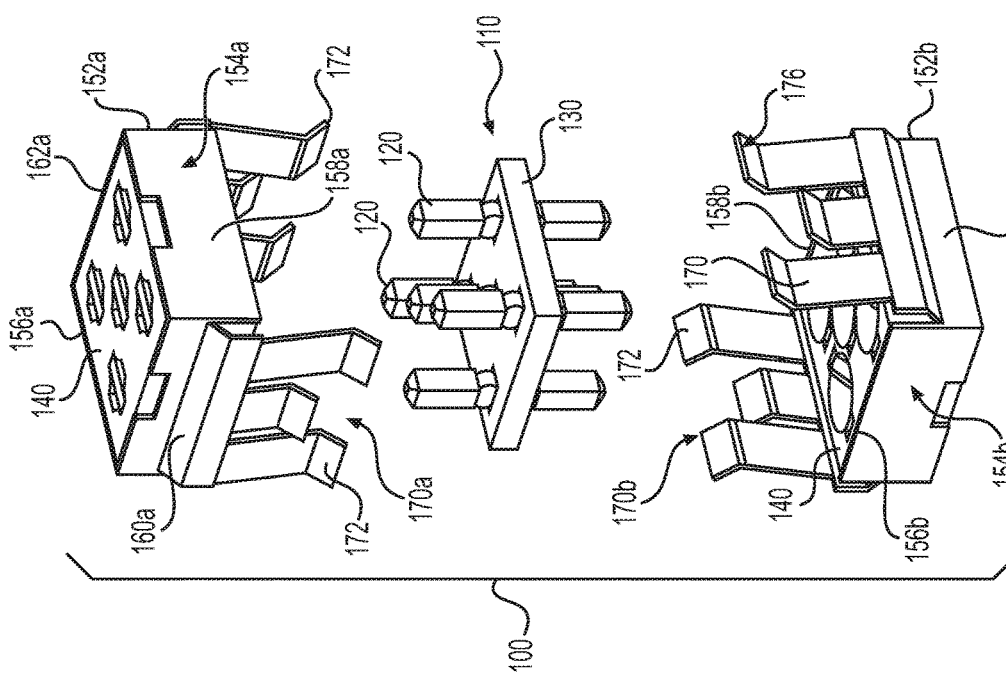
Figure 2C:
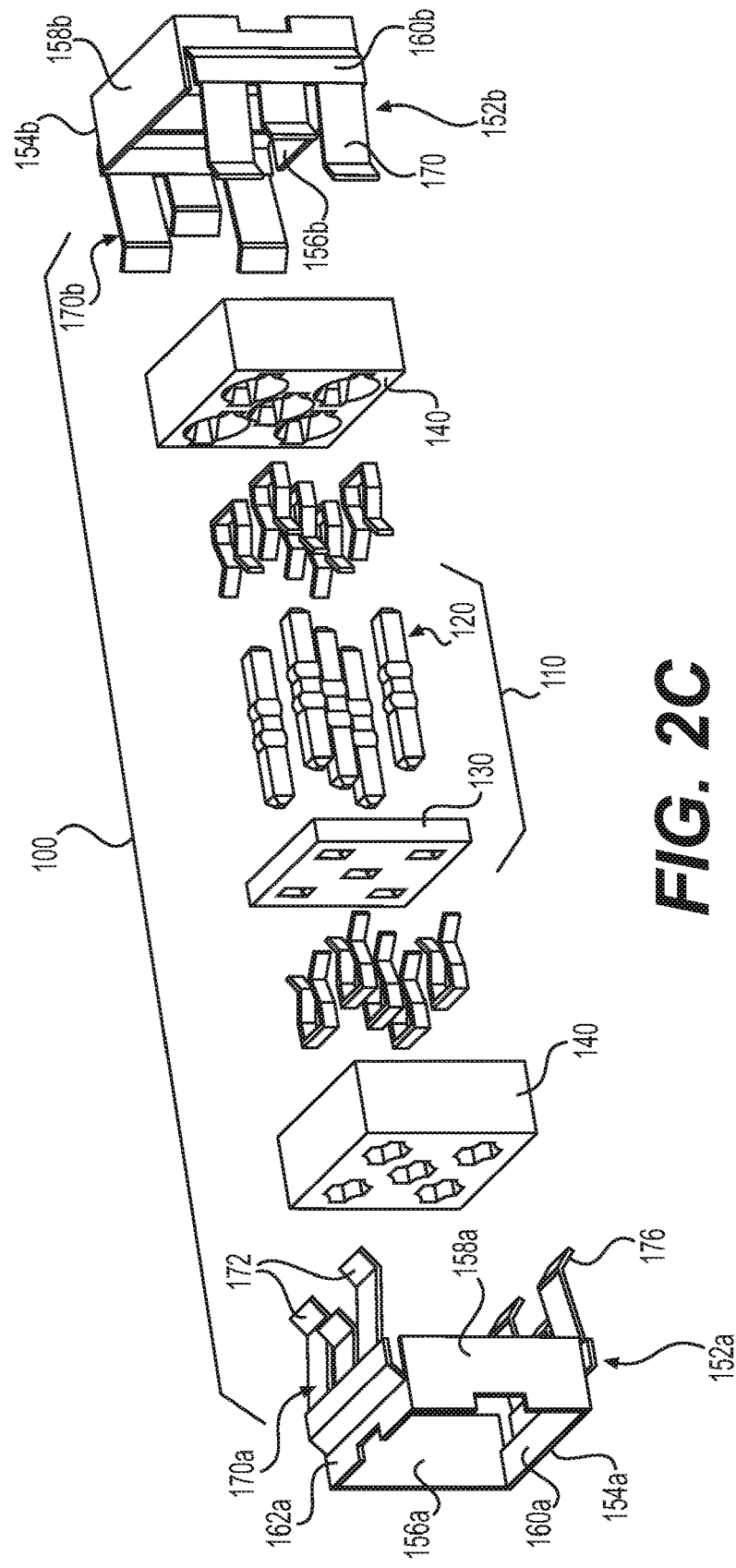

FIGS. 1A and 1B illustrate two of a shielded connector 100 according to a first exemplary embodiment of the present invention, that interconnects the circuit boards 10 and 12 and establishes electrical continuity therethrough. The shielded connector 100 includes a float connector 102 and shielding 150 for the float connector 102. The float connector 102 is similar to the float connectors disclosed in commonly owned U.S. application Ser. No. 15/951,059 to Float Connector for Interconnecting Printed Circuit Boards, filed Apr. 11, 2018, the subject matter of which is herein incorporated by reference, which are configured to provide both axial and radial float to compensate for any axial and/or radial misalignment between the circuit boards 10 and 12. The connector 102 generally includes a contact assembly 110, that has a plurality of contacts 120 supported by a holder 130 (FIG. 2C), and guide members 140 associated with the circuit boards 10 and 12.

The holder 130 of the contact assembly 110 preferably holds the contacts 120 axially in place. In one embodiment, each contact 120 is held in a hole in the holder 130 with enough clearance to allow the contact 120 to radially tilt. This allows the connector 102 to compensate for any radial misalignment between the circuit boards 10 and 12. Also, the contacts 120 may slide axially within plated holes, for example, in the printed circuit boards 10 and 12, thereby allowing the contact assembly 110 and guide members 140 to move axially. That is, the contact assembly 110 and the guide members 140 may move along an axis generally parallel to the longitudinal axes of the contacts 120. This movement provides axial float to the connector 100 which compensates for axial misalignment between printed circuit boards 10 and 12. Alternatively, the contacts 120 may be spring biased pins that move axially and engage a conductive pad or trace on the circuit boards 10 and 12.

FIGS. 2A-2D illustrate the shielded connector 100 according to a first exemplary embodiment of the present invention. The shielding 150 of connector 100 generally creates an electrical cage around the float connector 102. The shielding 150 may include first and second shields 152a and 152b associated with a respective guide members 140. In an embodiment, the first and second shields 152a and 152b may be substantially identical. Each shield 152a and 152b includes a frame 154a and 154b with one or more extension features 170a and 170b. Each frame 154a and 154b has opposite sides 156a, 158a and 156b, 158b, respectively, and opposite ends 160a, 162a and 160b, 162b, respectively, extending between the opposite sides. Each end 160a, 162a, 160b, and 162b may include one or more of the extension features 170a, 170b. In a preferred embodiment, each extension feature 170a and 170b comprises one or more spring arms 172. In another embodiment, each extension feature 170a and 170b comprises a plurality of spring arms 172. In yet another embodiment, at least one spring arm 174 of the plurality of spring arms 172 is shorter than the other spring arms.

Figure 2D:
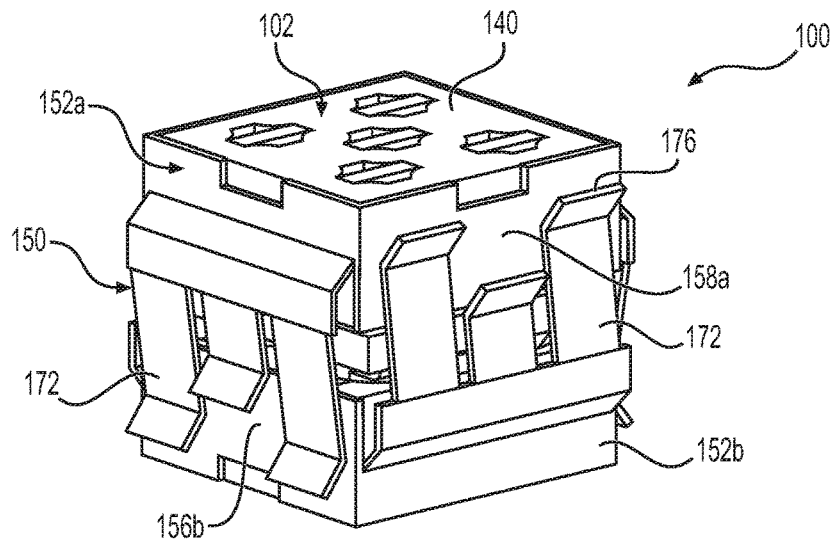
FIG. 2D is a perspective view of the assembled shielded connector illustrated in FIGS. 1A and 1B.

Each spring arm 172 has a free end 176 configured to engage the other shield. The one or more spring arms 172 extending from the ends 160a and 162a of the first shield 152b are designed to engage each side 156b and 158b, respectively, of the second shield 152b, as best seen in FIG. 2D. Likewise, the one or more spring arms 172 extending from the ends 160b and 162b of the second shield 152b are designed to engage each side 156a and 158a, respectively, of the first shield 152a. These arms create electrical continuity between the shields 152a and 152b to form a shield to block both ingress and leakage of signals.

Figure 3:
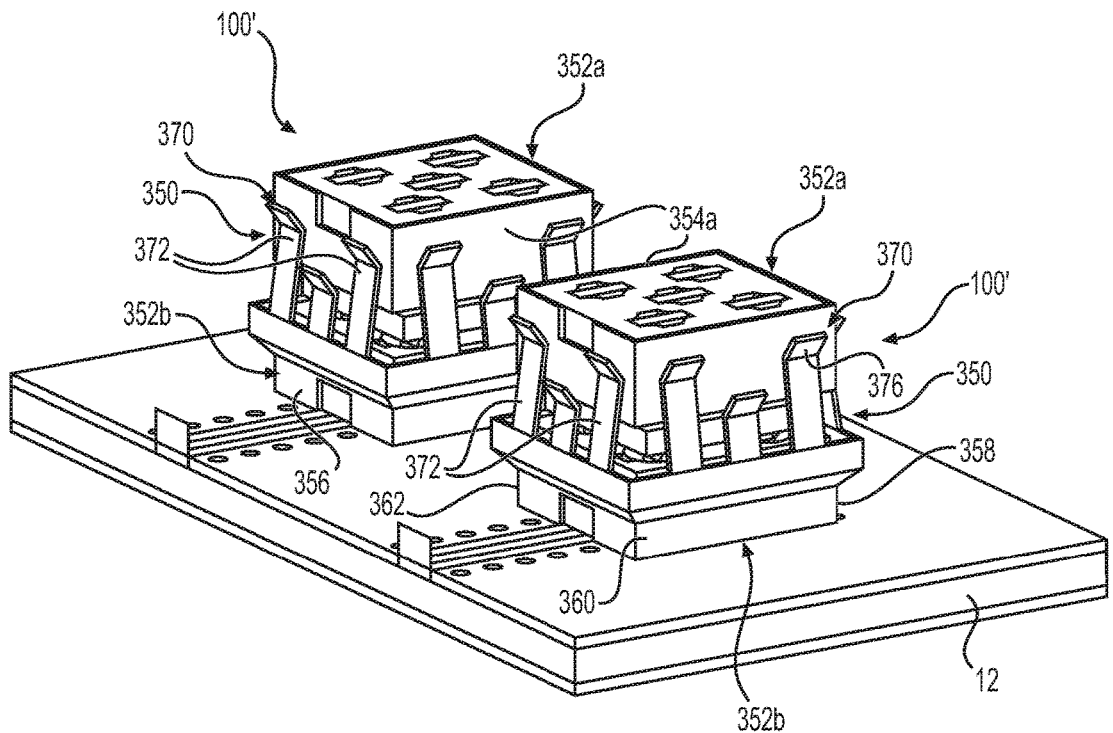
FIG. 3 is a perspective view of a shielded connector according to a second exemplary embodiment of the present invention, without one of the two printed circuit boards for clarity.

FIG. 3 illustrates a shielded connector 100' according to a second exemplary embodiment of the present invention. The shielded connector 100' may include shielding 350 for the connector 102. Like shielding 150 of the first embodiment, the shielding 350 includes first and second shields 352a and 352b that cooperate with one another to provide electrical continuity therebetween. Unlike the shielding 150, the first shield 352a of shielding 350 does not include an extension feature. Instead, the shield 352a includes only a frame 354a. Also, the second shield 352b preferably includes extension features 370 extending from both sides 356 and 358 and both ends 360 and 362 of its frame 354b. Like the first embodiment, the extension feature 370 of the second frame 352b comprises one or more spring arms 372. Each spring arm 372 has a free end 376 configured to engage the frame 354a of the first shield 352a.

Figure 4A:
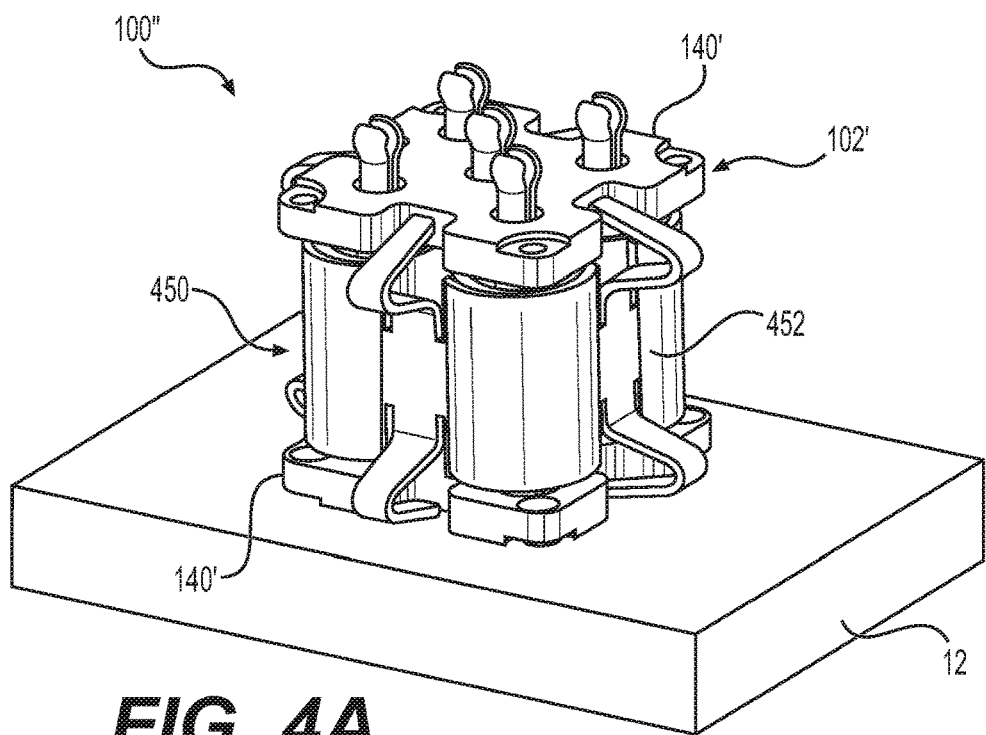
FIG. 4A is a perspective view a shielded connector according to a third exemplary embodiment of the present invention, without one of the two printed circuit boards for clarity.
Figure 4B:
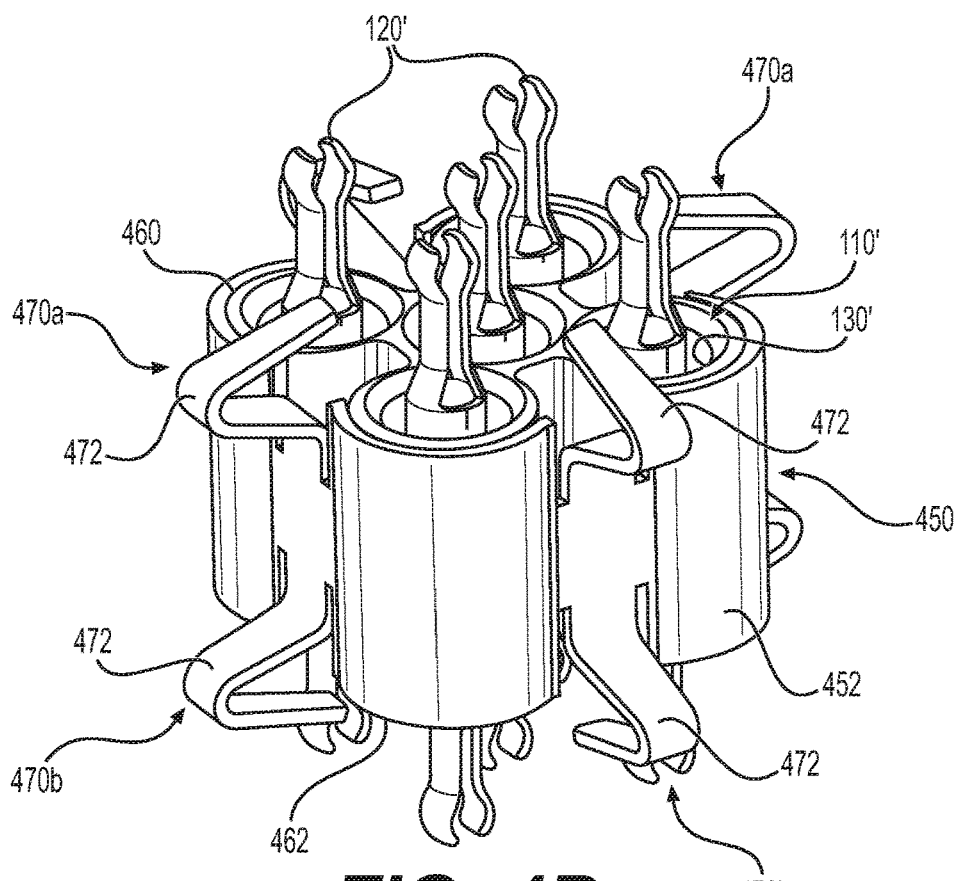
FIG. 4B is a perspective view of a contact assembly of the shielded connector illustrated in FIG. 4A.

FIGS. 4A and 4B illustrate a shielded connector 100" according to a third exemplary embodiment of the present invention. The shielded connector 100" may include shielding 450 for a float connector 102'. Like float connector 102, float connector 102' generally includes a contact assembly 110', that has a plurality of contacts 120' supported by a holder 130', and guide members 140' associated with the circuit boards.

Shielding 450 of the third embodiment is designed to generally surround the contact assembly 110'. The shielding 450 may include a shield 452 that substantially surrounds the holder 130' of the contact assembly 110'. Opposing ends 460 and 462 of the shield 452 preferably include an extension feature 470a and 470b, respectively, that electrically engage the printed circuit boards 10 and 12, respectively. Each of extension features 470a and 470b may comprise one or more spring arms 472 that contact conductive areas, such as plated holes, pads, or traces, of the circuit boards to establish electrically continuity through the shield 452. In one embodiment, each of the spring arms 472 may have a folded shape, as seen in FIG. 4B.

Figure 5:
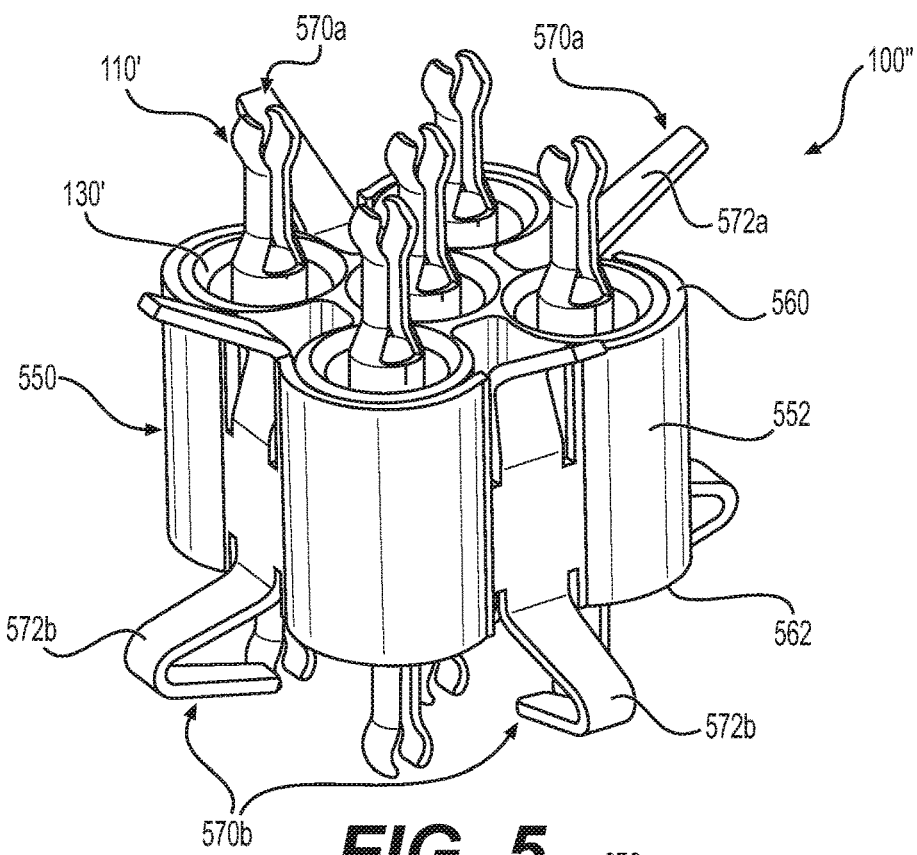
FIG. 5 is a perspective view of an alternative contact assembly for the shielded connector illustrated in FIG. 4A.

FIG. 5 illustrates an alternative shielding 550 for the shielded connector 100". Like shielding 450, the shielding 550 includes a shield 552 that substantially surrounds the holder 130' of the contact assembly 110'. And opposing ends 560 and 562 of the shield 552 preferably include an extension feature 570a and 570b, respectively, that electrically engage the printed circuit boards 10 and 12, respectively. Extension features 570a and 570b may be different from one another. The extension feature 570a may be one or more spring arms 572a and the extension feature 570b may be one or more spring arms 572b that may be shaped differently that the spring arms 572a. For example, the spring arms 572a may have a generally straight and angled shape where the spring arms 572b may have a folded shape.

Figure 6:
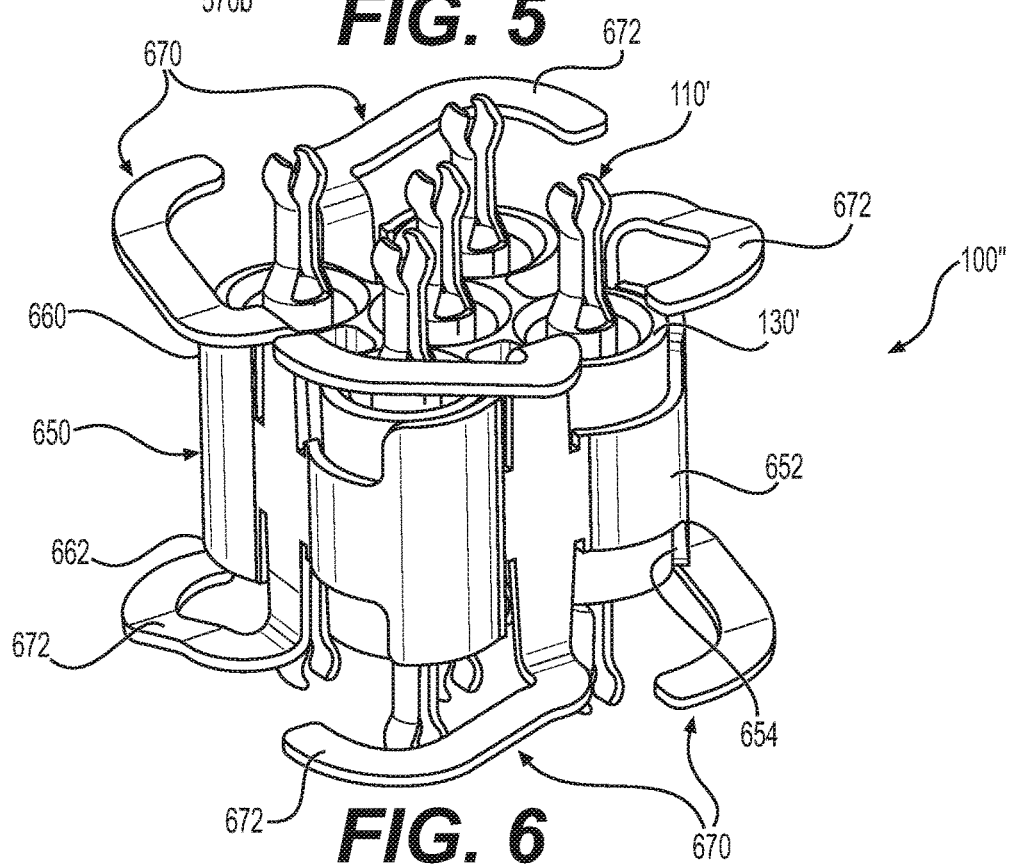
FIG. 6 is a perspective view of yet another alternative contact assembly for the shielded connector illustrated in FIG. 4A.

FIG. 6 illustrates yet another alternative shielding 650 for the shielded connector 100". Like shielding 450, the shielding 650 includes a shield 652 that generally surrounds the holder 130' of the contact assembly 110'. The shield 652 may include some open areas 654. The opposing ends 660 and 662 of the shield 652 preferably include an extension feature 670 that electrically engages the printed circuit boards 10 and 12, respectively. The extension feature 670 may be one or more spring arms 672. Each springs arms 672 may be curved to form a generally C-shape.

While particular embodiments have been chosen to illustrate the invention, it will be understood by those skilled in the art that various changes and modifications can be made therein without departing from the scope of the invention as defined in the appended claims. For example. To facilitate achieving proper impedance between the signal and ground, the float connector of the present invention may have at least one signal and one ground contact. Adding more ground contacts to the above embodiments can improve impedance consistency and shielding to prevent signal from leaking (crosstalk) between closely placed signal lines.

What is claimed is:

1. A shielded connector for interconnecting printed circuit boards, comprising
   a contact assembly including a plurality of contacts electrically connectable to the printed circuit boards;
   first and second guide members separable from the contact assembly, each of the first and second guide members being associated with one of the printed circuit boards; and
   first and second shields electrically connectable to the printed circuit boards and substantially surrounding at least a portion of the first and second guide members, respectively, each of the first and second shields having at least one portion configured to contact the other of the first and second shields, thereby creating electrical continuity therebetween.

2. The shielded connector of claim 1, wherein the at least one portion of the first shield is an extension feature that contacts the second shield.

3. The shielded connector of claim 2, wherein the extension feature is at least one spring arm that contacts a frame of the second shield.

4. The shielded connector of claim 2, wherein the at least one portion of the second shield is an extension feature that contacts the first shield.

5. The shielded connector of claim 4, wherein each extension feature comprises at least one spring arm that extends from a frame of the first and second shields, respectively, and the at least one spring arm of the first shield contacts the frame of the second shield and the at least one spring arm of the second shield contacts the frame of the first shield.

6. The shielded connector of claim 5, wherein each extension feature comprises a plurality of spring arms and one of the plurality of spring arms and shorter than the other of the plurality of spring arms.

7. The shielded connector of claim 1, each of the first and second shields comprises a frame with opposite first and second sides and opposite first and second ends extending between the sides, the at least one portion of the first shield is an extension feature that extends from one or both of the sides of the frame of the first shield to contact the frame of the second shield.

8. The shielded connector of claim 7, wherein the extension feature extends from one or both of the ends of the frame of the first shield to contact the frame of the second shield.

9. The shielded connector of claim 7, the at least one portion of the second shield is an extension feature that extends from one or both of the sides of the frame of the second shield to contact the frame of the first shield.

10. The shielded connector of claim 9, wherein the extension feature extending from one or both sides of the frame of the first shield contacts one or both of the ends of the frame of the second shield.

11. The shielded connector of claim 10, wherein each of the extension features comprises one or more spring arms, each spring arm of one of the first and second shields has a free end for contacting the frame of the other of the first and second shields.

12. The shielded connector of claim 1, wherein the first and second shields are substantially identical.

13. The shielded connector of claim 1, wherein the contact assembly and the first and second guide members are configured to provide axial and radial float to compensate for axial and radial misalignment between the printed circuit boards.

14. A shielded connector for interconnecting printed circuit boards, comprising
    a contact assembly including a plurality of contacts electrically connectable to the printed circuit boards;
    first and second guide members separable from the contact assembly, each of the first and second guide members being associated with one of the printed circuit boards; and
    a shield electrically connectable to the printed circuit boards and substantially surrounding at least a portion of the contact assembly, the shield having portions at opposing ends thereof, respectively, configured to contact the printed circuit boards, thereby creating electrical continuity therebetween.

15. The shielded connector of claim 14, wherein the shield surrounds the contact assembly and each portion is an extension feature configured to electrically engage one of the printed circuit boards.

16. The shielded connector of claim 15, wherein the shield is disposed between the first and second guide members.

17. The shielded connector of claim 15, wherein each extension feature comprises at least one spring arm.

18. The shielded connector of claim 17, wherein each spring arm has folded shape.

19. The shielded connector of claim 17, wherein the at least one spring arm extending from one end of the shield has a different shape than the at least one spring arm extending from the other end of the shield.

20. The shielded connector of claim 17, wherein each spring arm has a curved shape.

21. A shielded connector for interconnecting printed circuit boards, comprising:
    a contact assembly including a plurality of contacts electrically connectable to the printed circuit boards;

first and second guide members separable from the contact assembly, each of the first and second guide members being associated with one of the printed circuit boards; and means for shielding that establishes electrical continuity through the connector, wherein the contact assembly and the first and second guide members are configured to provide axial and radial float to compensate for axial and radial misalignment between the printed circuit boards.

\* \* \* \* \*